US006022667A

United States Patent [19]

Vermeersch et al.

[11] Patent Number: 6,022,667

[45] Date of Patent: Feb. 8, 2000

[54] HEAT SENSITIVE IMAGING ELEMENT AND A METHOD FOR PRODUCING LITHOGRAPHIC PLATES THEREWITH

[75] Inventors: Joan Vermeersch, Deinze; Marc Van Damme, Heverlee; Eric Verschueren, Merksplas; Guy Hauquier, Nijlen, all of Belgium

[73] Assignee: Agfa-Gevaert, N.V., Mortsel, Belgium

[21] Appl. No.: 09/073,343

[22] Filed: May 6, 1998

Related U.S. Application Data

[60] Provisional application No. 60/050,854, Jun. 26, 1997.

[51] Int. Cl.$^7$ ........................................ G03F 7/11

[52] U.S. Cl. .................................... 430/271.1; 430/270.1; 430/281.1; 430/282.1; 430/286.1; 430/926; 430/944

[58] Field of Search ............................. 430/271.1, 281.1, 430/282.1, 286.1, 926, 944

[56] References Cited

U.S. PATENT DOCUMENTS

| | | | |
|---|---|---|---|
| 3,679,410 | 7/1972 | Vrancken et al. . | |
| 5,340,693 | 8/1994 | Uytterhoeven et al. | 430/253 |
| 5,478,695 | 12/1995 | Leenders | 430/259 |
| 5,811,215 | 9/1998 | Van Damme et al. | 430/201 |

FOREIGN PATENT DOCUMENTS

| | | |
|---|---|---|
| 0 559 510 A2 | 6/1994 | European Pat. Off. . |
| 0 559 510 A3 | 6/1994 | European Pat. Off. . |
| 0 599 510 B1 | 4/1997 | European Pat. Off. . |
| 0 770 494 A2 | 5/1997 | European Pat. Off. . |
| 0 770 495 A1 | 5/1997 | European Pat. Off. . |
| 1 160 221 | 8/1969 | United Kingdom . |

*Primary Examiner*—John S. Chu
*Assistant Examiner*—Barbara Gilmore
*Attorney, Agent, or Firm*—Breiner & Breiner

[57] ABSTRACT

According to the present invention there is provided a heat sensitive imaging element comprising a lithographic base with a hydrophilic surface, an image forming layer including a hydrophobic thermoplastic polymer latex and a compound capable of converting light into heat being present in said image forming layer or a layer adjacent thereto, characterized in that the heat-sensitive imaging element comprises a barrier layer between the lithographic base having a hydrophilic surface and the image forming layer, said barrier layer and said image forming layer being removable in an aqueous solution with a pH of at least 5.

9 Claims, No Drawings

HEAT SENSITIVE IMAGING ELEMENT AND A METHOD FOR PRODUCING LITHOGRAPHIC PLATES THEREWITH

The application claims the benefit of U.S. Provisional Application No. 60/050,854 filed Jun. 26, 1997.

FIELD OF THE INVENTION

The present invention relates to a heat sensitive material for making a lithographic printing plate. The present invention further relates to a method for preparing a printing plate from said heat sensitive material.

BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy ink in the photo-exposed (negative working) or in the non-exposed areas (positive working) on a hydrophilic background.

In the production of common lithographic plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of the light-sensitive layer the exposed image areas become insoluble and the unexposed areas remain soluble. The plate is then developed with a suitable liquid to remove the diazonium salt or diazo resin in the unexposed areas.

On the other hand, methods are known for making printing plates involving the use of imaging elements that are heat sensitive rather than photosensitive. A particular disadvantage of photosensitive imaging elements such as described above for making a printing plate is that they have to be shielded from the light. Furthermore they have a problem of sensitivity in view of the storage stability and they show a lower resolution. The trend towards heat sensitive printing plate precursors is clearly seen on the market.

For example, Research Disclosure no. 33303 of January 1992 discloses a heat sensitive imaging element comprising on a support a cross-linked hydrophilic layer containing thermoplastic polymer particles and an infrared absorbing pigment such as e.g. carbon black. By image-wise exposure to an infrared laser, the thermoplastic polymer particles are image-wise coagulated thereby rendering the surface of the imaging element at these areas ink acceptant without any further development. A disadvantage of this method is that the printing plate obtained is easily damaged since the non-printing areas may become ink accepting when some pressure is applied thereto. Moreover, under critical conditions, the lithographic performance of such a printing plate may be poor and accordingly such printing plate has little lithographic printing latitude.

EP-A-514145 discloses a heat sensitive imaging element including a coating comprising core-shell particles having a water insoluble heat softenable core component and a shell component which is soluble or swellable in aqueous alkaline medium. Red or infrared laser light directed image-wise at said imaging element causes selected particles to coalesce, at least partially, to form an image and the non-coalesced particles are then selectively removed by means of an aqueous alkaline developer. Afterwards a baking step is performed. However the printing endurance of a so obtained printing plate is low.

EP-A-599510 discloses a heat sensitive imaging element which comprises a substrate coated with (i) a layer which comprises (1) a disperse phase comprising a water-insoluble heat softenable component A and (2) a binder or continuous phase consisting of a component B which is soluble or swellable in aqueous, preferably aqueous alkaline medium, at least one of components A and B including a reactive group or precursor therefor, such that insolubilisation of the layer occurs at elevated temperature and/or on exposure to actinic radiation, and (ii) a substance capable of strongly absorbing radiation and transferring the energy thus obtained as heat to the disperse phase so that at least partial coalescence of the coating occurs. After image-wise irradiation of the imaging element and developing the image-wise irradiated plate, said plate is heated and/or subjected to actinic irradiation to effect insolubilization. However the printing endurance of a so obtained printing plate is low.

EP-A-625728 discloses an imaging element comprising a layer which is sensitive to UV- and IR-irradiation and which can be positive or negative working. This layer comprises a resole resin, a novolac resin, a latent Bronsted acid and an IR-absorbing substance. The printing results of a lithographic plate obtained by irradiating and developing said imaging element are poor.

U.S. Pat. No. 5,340,699 is almost identical with EP-A-625728 but discloses the method for obtaining a negative working IR-laser recording imaging element. The IR-sensitive layer comprises a resole resin,a novolac resin, a latent Bronsted acid and an IR-absorbing substance. The printing results of a lithographic plate obtained by irradiating and developing said imaging element are poor.

U.S. Pat. No. 4,708,925 discloses a positive working imaging element including a photosensitive composition comprising an alkali-soluble novolac resin and an onium-salt. This composition can optionally contain an IR-sensitizer. After image-wise exposing said imaging element to UV—visible—or eventually IR-radiation followed by a development step with an aqueous alkali liquid there is obtained a positive working printing plate. The printing results of a lithographic plate obtained by irradiating and developing said imaging element are poor.

EP-A-770494 and EP-A 770495 discloses a method for making a lithographic printing plate using an imaging element comprising (i) on a hydrophilic surface of a lithographic base an image forming layer comprising hydrophobic thermoplastic polymer particles dispersed in a hydrophilic binder and (ii) a compound capable of converting light to heat , said compound being comprised in said image forming layer or a layer adjacent thereto. Both applications disclose that there can be one or more layers intermediate layers provided between the lithographic base and the image forming layer. Said applications do not disclose that said intermediate layer should be soluble in an aqueous solution with a pH of at least 5.

GB 1,160,221 discloses a method of recording information, wherein a recording material is used comprising a water-permeable recording layer which incorporates hydrophobic thermoplastic polymeric material in the form of particles solid at room temperature and which can be rendered water-impermeable or substantially less water-permeable by the action of heat, said recording material also incorporating, in heat-conductive relationship to said polymer particles, a substance or substances which is or are distributed over the whole area of such material and is or are capable of being heated by exposing the material to intense electromagnetic radiation which is absorbed by such substance or substances. Said substance or substances can be incorporated in an intermediate layer. However the disclosure is silent about the fact that said layers should be removable in an aqueous solution with a pH of at least 5. The examples even disclose hardened gelatine layers, which are surely not removable.

EP-A-96200972.6 discloses a heat sensitive imaging element comprising on a hydrophilic surface of a lithographic base an image forming layer comprising hydrophobic thermoplastic polymer particles dispersed in a water insoluble alkali soluble or swellable resin and a compound capable of converting light into heat, said compound being present in said image forming layer or a layer adjacent thereto, wherein said alkali swellable or soluble resin comprises phenolic hydroxy groups and/or carboxyl groups. However the printing plates obtained from said heat-sensitive imaging element gives prints with scumming.

All the disclosed systems either require a treatment after the development step and/or or yield lithographic plates with poor printing properties. So, there is still a need for a heat sensitive imaging element that is easy to process and yields a lithographic plate with good or excellent printing properties.

SUMMARY OF THE INVENTION

It is an object of the present invention to provide a heat sensitive imaging element for making in a convenient way a lithographic printing plate having excellent printing properties.

It is another object of the present invention to provide a method for obtaining in a convenient way a negative working lithographic printing plate of a high quality using said imaging element.

It is still another object of the present invention to provide a method for obtaining in a convenient way a negative working lithographic printing plate which gives prints without scumming using said imaging element.

Further objects of the present invention will become clear from the description hereinafter.

According to the present invention there is provided a heat sensitive imaging element comprising a lithographic base with a hydrophilic surface, an image forming layer including a hydrophobic thermoplastic polymer latex and a compound capable of converting light into heat being present in said image forming layer or a layer adjacent thereto, characterized in that the heat-sensitive imaging element comprises a barrier layer between the lithographic base having a hydrophilic surface and the image forming layer, said barrier layer and said image forming layer being removable in an aqueous solution with a pH of at least 5.

According to the present invention there is also provided a method for obtaining a lithographic printing plate comprising the steps of:

(a) image-wise or information-wise exposing to light or heat an imaging element as described above (b) developing said exposed imaging element with an aqueous developing solution having a pH of at least 5 in order to remove the unexposed areas and thereby form a lithographic printing plate.

DETAILED DESCRIPTION OF THE INVENTION

It has been found that lithographic printing plates of high quality, giving prints without scumming can be obtained according to the method of the present invention using an imaging element as described above. More precisely it has been found that said printing plates are of high quality and are provided in a convenient way, thereby offering economical and ecological advantages.

An imaging element for use in accordance with the present invention comprises on a hydrophilic surface of a lithographic base in the order given a barrier layer soluble in an aqueous medium of at least 5, preferably at room temperature and an image forming layer comprising a hydrophobic thermoplastic polymer latex, removable on the areas where the barrier layer is dissolved.

The barrier layer is preferably soluble in an aqueous solution having a pH of at least 6, more preferably having a pH of at least 7. The barrier layer has preferably a dry thickness ranging from 0.01 to 1 g/m$^2$, more preferably from 0.05 to 0.5 g/m$^2$.

In one embodiment the barrier layer is only soluble in an aqueous solution having a pH of at least 10. Said alkali-soluble barrier layer comprises an alkali soluble binder. Suitable alkali soluble binders for use in an image forming layer in connection with this embodiment are for example synthetic novolac resins such as ALNOVOL, a registered trade mark of Reichold Hoechst and DUREZ, a registered trade mark of OxyChem and synthetic polyvinylfenols such as MARUKA LYNCUR M, a registered trade mark of Dyna Cyanamid.

The alkali soluble binder used in connection with the present embodiment is preferably not cross-linked or only slightly cross-linked.

In another embodiment the barrier layer is already soluble in an aqueous solution having a pH of at least 5. Said aqueous soluble barrier layer comprises a binder soluble in an aqueous solution with a pH of at least 5. Suitable aqueous soluble binders for use in an image forming layer in connection with this embodiment are for example polymers containing an acid group, preferably a carboxyl group. More preferably said aqueous soluble polymer is a (co)polymer containing hydroxy groups which have at least partially reacted with a compound comprising at least two carboxyl groups. Most preferably said alkali soluble polymer containing hydroxy groups also contains hydrophobic groups such as acetal groups. Preferably the molecular weight of said alkali soluble polymer ranges from 10,000 to 1,000,000, more preferably from 20,000 to 300,000.

Very preferred polymers for use in the barrier layer according to the invention have a structure as represented by formula I, wherein n ranges from 50 to 78% m ranges from 21 to 49% p ranges from 1 to 5% q ranges from 0 to 28%

Form I

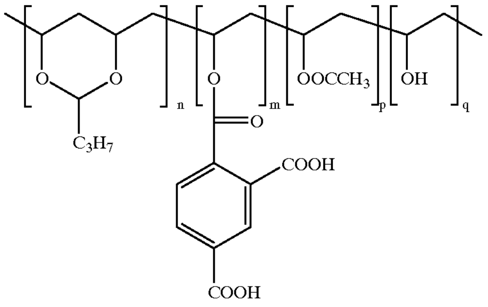

According to one embodiment of the present invention, the lithographic base having a hydrophilic surface can be an anodized aluminum. A particularly preferred lithographic base having a hydrophilic surface is an electrochemically grained and anodized aluminum support. According to the present invention, an anodized aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or can be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde. It is further evident that one or more of these post treatments may be carried out alone or in combination.

According to another embodiment in connection with the present invention, the lithographic base having a hydrophilic surface comprises a flexible support, such as e.g. paper or plastic film, provided with a cross-linked hydrophilic layer. A particularly suitable cross-linked hydrophilic layer may be obtained from a hydrophilic binder cross-linked with a cross-linking agent such as formaldehyde, glyoxal, polyisocyanate or a hydroyzed tetra-alkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, preferably between 0.5 and 5 parts by weight, more preferably between 1.0 parts by weight and 3 parts by weight.

A cross-linked hydrophilic layer in a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range of 0.2 to 25 μm and is preferably 1 to 10 μm.

Particular examples of suitable cross-linked hydrophilic layers for use in accordance with the present invention are disclosed in EP-A 601240, GB-P-1419512, FR-P-2300354, U.S. Pat. No. 3,971,660, U.S. Pat. No. 4,284,705 and EP-A 514490.

As flexible support of a lithographic base in connection with the present embodiment it is particularly preferred to use a plastic film e.g. substrated polyethylene terephthalate film, cellulose acetate film, polystyrene film, polycarbonate film etc . . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A 619524, EP-A 620502 and EP-A 619525. Preferably, the amount of silica in the adhesion improving layer is between 200 mg per $m^2$ and 750 mg per $m^2$. Further, the ratio of silica to hydrophilic binder is preferably more than 1 and the surface area of the colloidal silica is preferably at least 300 $m^2$ per gram, more preferably at least 500 $m^2$ per gram.

The hydrophobic thermoplastic polymer latex can be dispersed in a hydrophilic binder.

The image forming layer comprising a hydrophilic binder used in connection with the present invention is preferably not crosslinked or only slightly crosslinked. Suitable hydrophilic binders for use in an image-forming layer in connection with this invention are water soluble (co)polymers for example synthetic homo- or copolymers such as polyvinylalcohol, a poly(meth)acrylic acid, a poly(meth) acrylamide, a polyhydroxyethyl(meth)acrylate, a polyvinylmethylether, a copolymer according to formula I or natural binders such as gelatin, a polysaccharide such as e.g. dextran, pullulan, cellulose, arabic gum, alginic acid.

The hydrophilic binder can also be a water insoluble, alkali soluble or swellable resin having phenolic hydroxy groups and/or carboxyl groups.

Preferably the water insoluble, alkali soluble or swellable resin used in connection with the present invention comprises phenolic hydroxy groups. Suitable water insoluble, alkali soluble or swellable resins for use in an image-forming layer in connection with this invention are for example synthetic novolac resins such as ALNOVOL, a registered trade mark of Reichold Hoechst and DUREZ, a registered trade mark of OxyChem and synthetic polyvinylfenols such as MARUKA LYNCUR M, a registered trade mark of Dyno Cyanamid.

The hydrophobic thermoplastic polymer latex can also be dispersed in an aqueous medium without a binder.

The hydrophobic thermoplastic polymer latices used in connection with the present invention preferably have a coagulation temperature above 50° C. and more preferably above 70° C. Coagulation may result from softening or melting of the thermoplastic polymer latices under the influence of heat. There is no specific upper limit to the coagulation temperature of the thermoplastic hydrophobic polymer latices, however the temperature should be sufficiently below the decomposition temperature of the polymer latices. Preferably the coagulation temperature is at least 10° C. below the temperature at which the decomposition of the polymer latices occurs. When said polymer latices are subjected to a temperature above the coagulation temperature they coagulate to form a hydrophobic agglomerate so that at these parts the hydrophobic latices become insoluble in plain water or an aqueous liquid.

Specific examples of hydrophobic thermoplastic polymer latices for use in connection with the present invention with a Tg above 80° C. are preferably polyvinyl chloride, polyvinylidene chloride, polyacrylonitrile, polyvinyl carbazole etc., copolymers or mixtures thereof. Most preferably used are polystyrene, polymethylmethacrylate or copolymers thereof.

When the hydrophobic thermoplastic polymer latex is dispersed in an aqueous medium without a binder said hydrophobic thermoplastic polymer latex preferably contains a water dispersing functional group such as an acid function. Preferred hydrophobic thermoplastic polymer dispersed latices in such embodiment are polymers of therephthalic acid or isophthalic acid with ethylene diglycol or copolymers of therephtalic acid and isophthalic acid with ethylene diglycol, said polymers or copolymers comprising sulphoisophthalic acid in an amount between 0.5 and 5%.

The weight average molecular weight of the hydrophobic thermoplastic polymer may range from 5,000 to 1,000,000 g/mol.

The hydrophobic thermoplastic polymer latex may have a particle size from 0.01 $\mu$m to 50 $\mu$m, more preferably between 0.05 $\mu$m and 10 $\mu$m and most preferably between 0.05 $\mu$m and 2 $\mu$m.

The hydrophobic thermoplastic polymer latex is present as a dispersion in the aqueous coating liquid of the image forming layer and may be prepared by the methods disclosed in U.S. Pat. No. 3,476,937. Another method especially suitable for preparing an aqueous dispersion of the thermoplastic polymer latex comprises:

- dissolving the hydrophobic thermoplastic polymer in an organic water immiscible solvent,
- dispersing the thus obtained solution in water or in an aqueous medium and
- removing the organic solvent by evaporation.

The amount of hydrophobic thermoplastic polymer latex contained in the image forming layer when said layer contains a hydrophilic binder is preferably between 20% by weight and 65% by weight and more preferably between 25% by weight and 55% by weight and most preferably between 30% by weight and 45% by weight.

The image forming layer if containing a hydrophilic binder can also comprise crosslinking agents although this is not necessary. Preferred crosslinking agents are low molecular weight substances comprising a methylol group such as for example melamine-formaldehyde resins, glycoluril-formaldehyde resins, thiourea-formaldehyde resins, guanamine-formaldehyde resins, benzoguanamine-formaldehyde resins. A number of said melamine-formaldehyde resins and glycoluril-formaldehyde resins are commercially available under the trade names of CYMEL (Dyno Cyanamid Co., Ltd.) and NIKALAC (Sanwa Chemical Co., Ltd.)

The imaging element further includes a compound capable of converting light to heat. Suitable compounds capable of converting light into heat are preferably infrared absorbing components although the wavelength of absorption is not of particular importance as long as the absorption of the compound used is in the wavelength range of the light source used for image-wise exposure. Particularly useful compounds are for example dyes and in particular infrared dyes, carbon black, metal carbides, borides, nitrides, carbonitrides, bronze-structured oxides and oxides structurally related to the bronze family but lacking the A component e.g. $WO_{2.9}$. It is also possible to use conductive polymer dispersion such as polypyrrole or polyaniline-based conductive polymer dispersions. The lithographic performance and in particular the print endurance obtained depends on the heat-sensitivity of the imaging element. In this respect it has been found that carbon black yields very good and favorable results.

A light to heat converting compound in connection with the present invention is most preferably added to the image forming layer but at least part of the light to heat converting compound may also be comprised in a neighbouring layer. Such layer can be for example the cross-linked hydrophilic layer of the lithographic base according to the second embodiment of lithographic bases explained above.

In accordance with a method of the present invention for obtaining a printing plate, the imaging element is image-wise exposed and subsequently developed with an aqueous solution having a pH of at least 5.

Image-wise exposure in connection with the present invention is preferably an image-wise scanning exposure involving the use of a laser or L.E.D. It is highly preferred in connection with the present invention to use a laser emitting in the infrared (IR) and/or near-infrared, i.e. emitting in the wavelength range 700–1500 nm. Particularly preferred for use in connection with the present invention are laser diodes emitting in the near-infrared.

After the development of an image-wise exposed imaging element with an aqueous solution having a pH of at least 5 and drying the obtained plate can be used as a printing plate as such. However, it is still possible to bake said plate at a temperature between 100° C. and 230° C. for a period of 40 minutes to 5 minutes. For example the exposed and developed plates can be baked at a temperature of 230° C. for 5 minutes, at a temperature of 150° C. for 10 minutes or at a temperature of 120° C. for 30 minutes.

The following examples illustrate the present invention without limiting it thereto. All parts are by weight unless otherwise specified.

EXAMPLE 1

Preparation of the Lithographic Base

A 0.20 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 $A/m^2$ to form a surface topography with an average center-line roughness Ra of 0.5 $\mu$m.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 $A/m^2$ for about 300 seconds to form an anodic oxidation film of 3.00 $g/m^2$ of $Al_2O_3$, then washed with demineralized water, posttreated with a solution containing polyvinylphosphonic acid (2.2 $g/m^2$).

Preparation of the Imaging Element

An imaging element according to the invention was prepared by first coating on the lithographic base a 2% solution in methylethylketone of a compound according to formula I wherein n is 70%, p is 3%, m+q is 27% in a wet thickness of 20 $\mu$m (dry weight of 0.3 $g/m^2$). Thereon was coated an aqueous dispersion of carbon black (0.06 $g/m^2$) and of a copolymer consisting of terephthalic acid (58 mol %), isophthalic acid (40 mol %) and sulphoisophthalic acid with ethylene glycol, said dispersed particles having a particle size of 67 nm (0.54 $g/m^2$).

This layer was coated from aqueous medium at pH=6.3.

In a comparative example a material was prepared, without first layer; the toplayer being directly coated onto the lithographic base.

Both materials were imaged with an external drum IR-laser imaging apparatus (diode laser 830 nm, drumspeed 1 m/s, addressability 5000 dpi, power level in image plane 80–120 mW), and developed in an aqueous developing solution (EN144 negative developer commercially available from Agfa) having a pH=8.3.

With the material having no first layer no selective clean-out could be obtained:

Optical density (Macbeth RD918-SB/Black filter)
imaged parts: 0.46
non-imaged parts: 0.49

With the material having a first layer a selective clean-out could be obtained, with full clean-out in the non-imaged parts:

Optical density (Macbeth RD918-SB/Black filter)
imaged parts: 0.42
non-imaged parts: 0.00

EXAMPLE 2

An imaging element was prepared according to the invention as described in example 1 with the exception that the pH of the aqueous dispersion (the top layer) was 8.5.

This material was imaged with an external drum IR-laser imaging apparatus (diode laser 830 nm, drumspeed 1 m/s, at addressabilities 5000 dpi and 200 dpi, power level in image plane 60–120 mW), and developed in an aqueous developing solution (EN144 negative developer commercially available from Agfa) having a pH=8.3, additionally a gum solution was applied to the developed plate and it was subsequently baked for 2 minutes at 200 ° C.

The material was selectively cleaned-out with full clean-out in the non-imaged parts; optical density (Macbeth RD918-SB/Black filter):

imaged parts: 0.37 non-imaged parts: 0.00

At 5000 dpi images were obtained using 60 mW power or more in imageplane.

At 200 dpi images were obtained using 70 mW power or more in imageplane.

This plate was used for printing on an Heidelberg GTO printing machine with a conventional ink (AB.Dick 1020) and fountain solution (Rotamatic), resulting in good prints, i.e. no scumming in non-imaged parts and good ink-uptake in imaged parts.

EXAMPLE 3

An imaging element was prepared according to the invention as described in example 1 with the exception that the pH of the aqueous dispersion (the top layer) was 10.

This material was imaged with an external drum IR-laser imaging apparatus (diode laser 830 nm, drumspeed 1 m/s, at addressabilities 5000 dpi and 200 dpi, power level in image plane 60–120 mW), and developed in an aqueous developing solution (EN144 negative developer commercially available from Agfa) having a pH=8.3, additionally a gum solution (Polychrome PC804 gum) was applied to the developed plate and it was subsequently baked for 2 minutes at 200°C.

The material was selectively cleaned-out with full clean-out in the non-imaged parts; optical density (Macbeth RD918-SB/Cyan filter):

imaged parts: 0.31 non-imaged parts: 0.00

At 5000 dpi images were obtained using 40 mW power or more in imageplane.

At 200 dpi images were obtained using 70 mW power or more in imageplane.

This plate was used for printing on an Heidelberg GTO printing machine with a conventional ink (AB.Dick 1020) and fountain solution (Rotamatic), resulting in good prints, i.e. no scumming in non-imaged parts and good ink-uptake in imaged parts.

EXAMPLE 4

An imaging element according to the invention was prepared by first coating on a lithographic base as described in example 1 a 1.25% solution in methylethylketone of Alnovol PN 249 binder (91%) and trihydroxybenzophenone (9%) in a dry weight of 0.1 $g/m^2$). Thereon was coated an 2% aqueous dispersion of carbon black (10%), polystyrene latex (75%) and of a compound according to formula I wherein n is 70%, p is 3%, m+q is 27% in a dry weight of 0.6 $g/m^2$).

This layer was coated from aqueous medium at pH=7.0.

The material was imaged with an internal drum IR-laser imaging apparatus (NdYAG laser 1060 nm, drumspeed 367 m/s, addressability 2400 dpi, power level in image plane 6 W), and developed in an aqueous developing solution (mixture of 4 parts EN144 negative developer and 1 part EP 351B positive developer, both solutions commercially available from Agfa) with 3 parts of water, said solution having a pH=13.

With this material a selective clean-out could be obtained, with full clean-out in the non-imaged parts: This plate was used for printing on an Heidelberg GTO printing machine with a conventional ink (AB.Dick 1020) and fountain solution (Rotamatic), resulting in good prints, i.e. no scumming in non-imaged parts and good ink-uptake in imaged parts.

EXAMPLE 5

Preparation of the Lithographic Base: as Described in Example 1

Preparation of the Imaging Element

An imaging element according to the invention was prepared by first coating on the lithographic base a 1.25% solution in methylethylketone of a compound according to formula I wherein n is 70%, p is 3%, m+q is 27% in a wet thickness of 30 $\mu$m (dry weight of 0.3 g/$m^2$). Thereon was coated an aqueous dispersion of carbon black (0.06 g/$m^2$) and of a copolymer consisting of terephthalic acid (58 mol %), isophthalic acid (40 mol %) and sulphoisophthalic acid with ethylene glycol, said dispersed particles having a particle size of 67 nm (0.54 g/$m^2$).

This layer was coated from aqueous medium at pH=5.8.

The material was imaged with an external drum IR-laser imaging apparatus (Nd laser 1064 nm, drumspeed 1 m/s, addressability 200 and 5000 dpi, power level in image plane 150–400 mW), and developed in an aqueous developing solution (EN144 negative developer commercially available from Agfa, pH adjusted with HCl to 6.6).

With these materials a selective clean-out could be obtained, with full clean-out in the non-imaged parts:

Optical density (Macbeth RD918-SB/Black filter)
imaged parts: 0.33
non-imaged parts: 0.00

At both 200 and 5000 dpi images were obtained using 150 mW power in the image plane.

This plate was used for printing on an Heidelberg GTO printing machine with a conventional ink (AB.Dick 1020) and fountain solution (Rotamatic), resulting in good prints, i.e. no scumming in non-imaged parts and good ink-uptake in imaged parts.

We claim:

1. A heat sensitive imaging element comprising a lithographic base with a hydrophilic surface, an image forming layer including a hydrophobic thermoplastic polymer latex and a compound capable of converting light into heat being present in said image forming layer or a layer adjacent thereto, wherein the heat-sensitive imaging element comprises a barrier layer between the lithographic base having a hydrophilic surface and the image forming layer, said barrier layer comprising a (co)polymer containing hydroxy groups which have at least partially reacted with a compound having at least two carboxyl groups, said barrier layer and said image forming layer being removable in an aqueous solution with a pH of at least 5.

2. A heat sensitive imaging element according to claim 1 wherein said barrier layer comprises a polymer containing phenolic or carboxyl groups or phenolic and carboxyl groups.

3. A heat sensitive imaging element according to claim 2 wherein said barrier layer comprises a novolac.

4. A heat sensitive imaging element according to claim 1 wherein said (co)polymer containing hydroxy groups also contains hydrophobic groups.

5. A heat sensitive imaging element according to claim 1 wherein said compound capable of converting light into heat is a member selected from the group consisting of an infrared absorbing dye, carbon black, a metal boride, a metal carbide, a metal nitride, a metal carbonitride and a conductive polymer dispersion.

6. A heat sensitive imaging element according to claim 1 wherein said lithographic base having a hydrophilic surface is anodized aluminum or comprises a flexible support having thereon a cross-linked hydrophilic layer.

7. A heat sensitive imaging element according to claim 1 wherein said image forming layer comprises a hydrophilic binder.

8. A heat sensitive imaging element according to claim 1 wherein said image forming layer comprises no binder.

9. A heat sensitive imaging element according to claim 8 wherein wherein said hydrophobic thermoplastic polymer latex contains a water dispersing functional group.

* * * * *

UNITED STATES PATENT AND TRADEMARK OFFICE
CERTIFICATE OF CORRECTION

PATENT NO. : 6,022,667
DATED : Feb. 8, 2000
INVENTOR(S) : Joan Vermeersch et al

It is certified that error appears in the above-indentified patent and that said Letters Patent is hereby corrected as shown below:

-- [30] Foreign Application Priority Data

May 27, 1997 [EP] European.......97201558 --

Column 7, bridging lines 37-38, "therephthalic" should read --terephthalic--.

Column 7, line 39, "therephtalic" should read --terephthalic--.

Signed and Sealed this

Tenth Day of April, 2001

*Attest:*

NICHOLAS P. GODICI

*Attesting Officer* *Acting Director of the United States Patent and Trademark Office*